(12) United States Patent
Ogawa et al.

(10) Patent No.: US 7,033,924 B2
(45) Date of Patent: Apr. 25, 2006

(54) VERSATILE SYSTEM FOR DIFFUSION LIMITING VOID FORMATION

(75) Inventors: Ennis T. Ogawa, Austin, TX (US); Joe W. McPherson, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 85 days.

(21) Appl. No.: 10/662,302

(22) Filed: Sep. 16, 2003

(65) Prior Publication Data

US 2004/0041274 A1 Mar. 4, 2004

Related U.S. Application Data

(62) Division of application No. 10/113,504, filed on Apr. 1, 2002, now Pat. No. 6,737,351.

(60) Provisional application No. 60/344,479, filed on Dec. 28, 2001.

(51) Int. Cl.
*H01L 21/4763* (2006.01)

(52) U.S. Cl. .................................. 438/622

(58) Field of Classification Search .......... 427/380, 427/397.7, 384, 343, 96, 337, 344, 378; 257/781, 257/632, 757–759, 40, 642, 637, 537, E23.161, 257/E23.145, E21.582, 773–775, 767; 438/734, 438/618, 622, 687, 637, 672, 926, 781, 763, 438/778, 758

See application file for complete search history.

(56) References Cited

U.S. PATENT DOCUMENTS

| | | | |
|---|---|---|---|
| 6,121,156 A | 9/2000 | Shamble et al. | 438/734 |
| 6,258,707 B1 | 7/2001 | Uzoh | 438/618 |
| 6,352,917 B1 | 3/2002 | Gupta et al. | 438/622 |
| 6,368,967 B1 | 4/2002 | Besser | 438/687 |
| 6,452,274 B1 * | 9/2002 | Hasegawa et al. | 257/758 |
| 6,468,894 B1 * | 10/2002 | Yang et al. | 438/622 |
| 6,492,259 B1 * | 12/2002 | Dirahoui et al. | 438/622 |
| 6,573,538 B1 * | 6/2003 | Motsiff et al. | 257/127 |
| 6,828,223 B1 * | 12/2004 | Chuang | 438/622 |

* cited by examiner

*Primary Examiner*—Michael Lebentritt
*Assistant Examiner*—Andre Stevenson
(74) *Attorney, Agent, or Firm*—Wade James Brady, III; Frederick J. Telecky, Jr.

(57) ABSTRACT

Disclosed is apparatus and method for decreasing diffusive damage effects to a primary structure (406, 506) within a semiconductor device (400, 500). The device typically comprises a first interconnect (402, 502), and a second interconnect (404, 504). The primary structure is disposed between the first and second interconnects to electrically intercouple them. An active diffusion volume (410, 514) is determined, within which the primary structure is located. A buffer structure (408, 508) is disposed upon the first interconnect in proximity to the primary structure and adapted to buffer the primary via structure from diffusive voiding occurring at a contact point between the primary structure and the first interconnect.

21 Claims, 2 Drawing Sheets

VERSATILE SYSTEM FOR DIFFUSION LIMITING VOID FORMATION

CROSS REFERENCE TO PRIOR APPLICATIONS

This application is a division of Ser. No. 10/113,504, filed Apr. 1, 2002 now U.S. Pat. No. 6,737,351, which claims priority based upon provisional application Ser. No. 60/344,479, filed Dec. 28, 2001.

FIELD OF THE INVENTION

The present invention relates in general to the fabrication and operation of semiconductor devices and, more particularly, to apparatus and methods for diffusion limiting voids formed in semiconductor device structures during fabrication and operation of the semiconductor device.

BACKGROUND OF THE INVENTION

The continual demand for enhanced integrated circuit performance has resulted in, among other things, a dramatic reduction of semiconductor device geometries, and continual efforts to optimize the performance of every substructure within a semiconductor device. A number of improvements and innovations in fabrication processes, material composition, and layout of the active circuit levels of semiconductor devices have resulted in very high-density circuit designs. Increasingly dense circuit design has, consequently, greatly improved a number of performance issues—such as minimizing signal propagation delays through the active circuit levels of semiconductor devices.

Only recently, however, have other layers and structures within semiconductor devices received such scrutiny and been the subject of optimization efforts. For many years, most semiconductor devices utilized "back-end" (e.g., metal interconnect and dielectric) layers based on very mature aluminum (Al) and silicon dioxide ($SiO_2$) technology. With the improvements in the active circuit levels, it was not uncommon for 50% or more of propagation delays to occur in the back-end layers, in semiconductor devices utilizing such mature back-end technologies. As a result, a large segment of semiconductor manufacturing is transitioning from the mature Al-based back-end materials and technologies to new, alternative materials and technologies. With that transition a number of new and unexpected challenges and problems arise—some of which are counter-intuitive based on an understanding of the mature back-end materials and technologies.

SUMMARY OF THE INVENTION

Among the new, alternative technologies being utilized, copper (Cu) and copper-based materials and technologies are gaining acceptance and preference for use in semiconductor device back-ends. Copper's relatively low resistivity and high melting point make it a particularly attractive metallization choice for high performance semiconductor devices. Using copper in semiconductor back-ends reduces path resistance, thus decreasing signal propagation delays. A low-K dielectric may be utilized in conjunction with copper metallization, further decreasing signal propagation delays through the back-end.

Because the use of copper based back-ends in semiconductor processing is still relatively immature, a number of physical properties and behaviors of copper, and the effects of those properties and behaviors on the performance of semiconductor devices, have yet to be fully comprehended. One such problem that has become prevalent in devices utilizing such back-end technologies is the formation of stress-induced voids (SIVs) around via structures—particularly vias that are relatively isolated and located in proximity to relatively wide metallic interconnects. The formation of such voids can destroy electrical conductivity in a device and present numerous and catastrophic device reliability problems.

Previously, the older, Al-based technologies often experienced very different void problems. Such problems were most prevalent in relatively narrow metallic interconnects. Voids would form in grain boundaries along the length of the interconnect and, if significant in size, would either partially or completely sever the continuity of the interconnect, causing an open in the device circuitry. Voiding around via structures, for most device applications, was not prevalent. Thus, previously developed methods of addressing void problems generally do not comprehend void formation around via structures in proximity to wide metallic interconnects. Those conventional methods were tailored toward dealing with voids along the span of very narrow metallic interconnects. Furthermore, such conventional methods are often rendered inefficient or impracticable with the use of copper and other new back-end design materials and processes.

Even designs currently utilizing copper and other new back-end materials and processes appear to address SIV problems in only an ad-hoc fashion. SIV problems do not appear to be addressed in a systematic fashion—they are dealt with only after they have resulted in reliability problems. Often, the problematic device is merely re-fabricated several times until a device without problems is yielded. Or, sometimes, individual device features are manually adjusted and the device re-processed. Obviously, such approaches are inefficient from cycle time and cost perspectives.

The present invention recognizes that a primary cause of SIVs is the diffusive migration of vacancies from the grain boundaries, interfaces, surfaces, lattice, or lattice interstices of the metal interconnect toward via structures. The present invention further recognizes that a number of stress gradients inherent in the fabrication and operation of such semiconductor devices promote and accelerate the diffusive migration of such vacancies toward via structures. Therefore, a versatile system for limiting the diffusive formation of stress-induced voids in semiconductor interconnect structures in a cost-effective and efficient manner is now needed; providing for consistent and scalable device design and fabrication, and for improved device performance and reliability, while overcoming the aforementioned limitations of conventional methods.

The present invention provides a system that substantially minimizes, and potentially eliminates, the effects of stress-induced voiding in dual-damascene structures. The present invention provides a system that addresses such effects from a structural perspective, a performance perspective, and a combined structural/performance perspective. In one embodiment of the present invention, the negative effects of SIV on device performance are mitigated through electrical redundancy. In another embodiment of the present invention, the negative effects of SIV are mitigated through diffusive buffers. In yet another embodiment of the present invention, electrical redundancy is employed in conjunction with diffusive buffering.

The present invention provides a system for producing semiconductor devices to decrease diffusive damage effects to a particular structure of concern (i.e., a primary structure). An active diffusion volume, within which the primary structure is located, is determined. Then, a buffer structure, adapted to share a select redundancy characteristic with the primary structure, is disposed within the active diffusion volume.

The present invention also provides a system for producing a semiconductor device having a copper-based, dual-damascene structure. An active diffusion volume, within which the dual-damascene structure is located, is determined. Then, a buffer structure, adapted to share a select redundancy characteristic with the dual-damascene structure, is disposed within the active diffusion volume.

The present invention further provides a system for semiconductor device structures comprising a first metallic interconnect, a second metallic interconnect, and a primary via structure, disposed between and electrically intercoupling the first and second metallic interconnects. A buffer structure is disposed upon the first metallic interconnect in proximity to the primary via structure, and adapted to buffer the primary via structure from diffusive voiding occurring at a contact point between the primary via structure and the first metallic interconnect.

BRIEF DESCRIPTION OF THE DRAWINGS

For a more complete understanding of the present invention, including its features and advantages, reference is made to the following detailed description, taken in conjunction with the accompanying drawings. Corresponding numerals and symbols in the different figures refer to corresponding parts unless otherwise indicated.

DETAILED DESCRIPTION

The present invention defines a system, comprising various structures and methods, for minimizing or eliminating the effects of stress-induced voiding in dual-damascene interconnect structures. The present invention provides a via redundancy scheme, a metal interconnect modification scheme, and combinations of both schemes in an easily scalable system that may be readily adapted and integrated into a number of device fabrication processes.

It should be understood that the principles disclosed herein may be applied in a wide range of semiconductor processing applications. Specifically, the present invention may be applied to any number of situations where stress-induced voiding is caused by the diffusive migration of material vacancies toward a particular structural element—regardless of the particular materials utilized or structures being processed. For purposes of explanation and illustration, however, the present invention is hereafter described in reference to stress-induced voids (SIVs) formed around via structures in device fabrication utilizing copper-based back-end materials and processes.

The transition from Al-based to Cu-based interconnect technology has been an important milestone for the continued evolution of semiconductor microelectronics. This technological evolution is due, at least in part, to the adoption of damascene and dual-damascene process flows, which utilize electrolytic Cu-plating and chemical mechanical polishing techniques. The benefits of using Cu, such as a systematic reduction in propagation-delays through a device back-end, are quite clear. The full reliability impact of using Cu is, however, only beginning to be realized and evaluated.

Because of the quite different process conditions associated with Cu versus Al-based interconnects, traditional wear-out mechanisms such as electro-migration (EM) and stress-induced voiding (SIV) must be reevaluated for the case of Cu. Understanding the EM reliability differences between Al and Cu is important and has received a fair amount of attention. SIV in Cu interconnects has received less attention because of Cu's favorable electrical properties versus Al (e.g., lower mobility because of higher activation energy) at similar stress levels.

The stress levels are similar because the thermal expansion coefficient of Cu is somewhat less than Al (16.5 vs. 23.9 ppm/° C.$^-$), but the Young's modulus of Cu is somewhat larger (110 vs. 70 GPa). If the zero stress point can be considered equivalent for both metals at, for example, 250° C., the resulting stresses in a Cu vs. Al interconnect on Si (3 ppm/° C.) at 150° C. would be 148.5 vs. 146.3 MPa, respectively. Thus, with much lower mobility and with similar stress levels, Cu is expected to have much better SIV resistance than Al. However, the assumption of Cu's excellent SIV robustness may be overly optimistic, as it is actually strongly process dependent.

SIV has been a rather difficult reliability problem to address quantitatively. The difficulties and issues surrounding SIV in Al-based interconnects are fairly well known. Briefly, Al-based SIV has been observed to be a problem primarily for narrow lines (~<4 μm). SIV has been believed to be driven by high hydrostatic stress levels in the Al interconnects and by the fairly rigid encapsulation process using $SiO_x$ and $Si_xN_y$ dielectrics. For narrow Al lines, with a nearly bamboo-like grain structure, the void profile usually has the feature of a wedge or notch that propagates (with time) across an interconnect line causing the line to open and produce circuit failure. These wedges are thought to nucleate first at grain boundaries near stress risers at the line edges.

This problem has been greatly mitigated by the use of SIV-resistant redundant metal layers (e.g., TiW, TiN, W) under the Al layer in the form of a bi-layer composite. Thus, any voiding in the Al layer produces only a rather small resistance rise for the interconnect system. However, if the SIV occurs at a via site, the resistance rise can be more troublesome.

Typically, SIV has been experimentally characterized by using metal test structures that are sensitive to SIV-induced resistance rises and then storing the devices in an unbiased condition at elevated temperatures (generally in the 150–200° C. range). Any resistance rise is then recorded at predetermined intervals. No current is normally applied to the test structures during baking so as to eliminate any contributions from EM-induced voiding. The SIV rate in Al will increase with temperature up to a critical temperature beyond which the SIV rate will actually decrease with temperature, going to zero at some stress-free temperature. A number of theories have been proposed to explain SIV and have their basis on either physical diffusion and/or creep behavior.

Quantitative analysis that can distinguish among the models is limited by a number of external factors that alter the failure rate, such as void morphology, metallization properties, encapsulating dielectric properties, and interconnect geometry. In the case of Cu metallization, such complicating factors also exist and the ideal test temperatures for SIV may not necessarily be identical to the case for Al.

As previously explained, Cu-based metallizations might, theoretically, be expected to have much more SIV robustness than Al-based metallizations—perhaps leading one to the erroneous assumption that Cu is immune to SIV. However, such comparisons are complicated by a number of factors. One possibility is that the stress-free temperature, $T_0$, for an Al-based interconnect and a Cu-based interconnect may be different. Another difference lies in the fact that Cu metallization process and dielectric materials can be quite different from those used traditionally for Al. Al-based metals are normally sputtered at high temperatures on $SiO_2$ dielectrics, which generally result in quite large as-deposited grain sizes. For Cu, however, electrochemical deposition (ECD) in a dual-damascene process flow can result in rather small as-deposited grain size. The initial stress level for the ECD Cu (deposited at room temp) is known to be near zero in the case of blanket films but changes dramatically upon subsequent thermal treatments. Importantly, thermal annealing can serve to produce significant grain growth and improve the quality of the Cu films. However, if the ECD Cu is fully constrained (e.g., by the barrier-lined trench sidewalls and with overlay of capping nitride) before the annealing takes place, then the grain-growth during further thermal processing can yield a Cu material that is supersaturated with vacancies. Comprehending this, the present invention addresses the reliability impact of a vacancy supersaturated Cu metallization. As a result of vacancy supersaturation, SIV can occur over, under, and within via structures, especially where those via structures are attached to wide Cu leads.

Within the context of SIV problems, the presence of a dual-damascene via might be considered a weak-link in the chain of interconnections that make up a working integrated circuit. This may be demonstrated through a number of studies and experiments. For purposes of explanation and illustration of the voiding problems in dual-damascene structures, one such demonstration methodology is summarized below.

In order to ensure that any voiding around a via may be easily detected by electrical resistance measurements, a dual-damascene processed Van der Pauw (VDP) via test-structure, serviced by ~3 µm wide metal leads, is used. In order to provide a basis for comparison, a companion evaluation may also be conducted for long, narrow via-fed stripes.

The interconnect process used is based on a 0.18 µm metallization technology using single damascene Cu on metal 1 (M1) and dual-damascene Cu on via 1 (V1) and metal 2 (M2). The metals are electro-chemically deposited (ECD) on physically vapor deposited (PVD) Cu seed that lies on top of a Ta-based diffusion barrier. The metallization is surrounded by a fairly rigid fluorinated silicate glass (FSG) and encapsulated by plasma-enhanced chemically vapor deposited (PECVD) $SiN_x$ barrier. Thus, the two-level metallization stack is fully confined by surrounding dielectric material.

The ECD Cu does not undergo post-ECD annealing, and thus may be considered as fully constrained prior to significant grain growth. After the Cu is fully constrained, by barrier-lined trench sidewalls and nitride capping layer, test structures continue processing through a normal 7-level metal process flow, ensuring a significant thermal budget for thermally-driven confined grain growth. Test structures are then subjected to unbiased stress migration (SM) baking for ~500 hrs with the baking temperature ranging from 100° C. to 250° C. The resistances of the test samples are measured periodically, at time equal time intervals (e.g., 168, 336, and 500 hrs).

The companion SIV evaluation for vias to long, minimum feature (~0.18 um) stripes reveals no significant VDP resistance rises up to 3000 hrs of storage over indicated temperature ranges (i.e., no significant SIV occurred). Thus, the simple theoretical argument suggesting that Cu interconnects should be less prone to SIV formation (in comparison to Al-based interconnects) appears to have strong merit.

Figure 1:
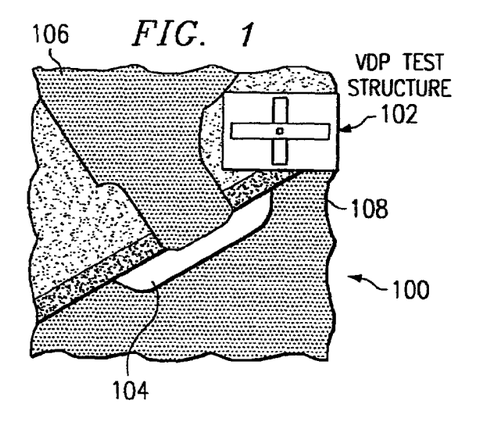
FIG. 1 illustrates a structure damaged by stress-induced voiding.

However, in the case of the VDP test structure, with a narrow via overlying a wider metal stripe, the assumption of Cu robustness to SIV is not justified. FIG. 1 provides an illustration. A cross-sectional photo 100 of a test structure, illustrated as inset 102, reveals a void-formation 104 under a small via 106 placed over a wide metal (M1) lead 108. Lead 108 is about 3 µm wide. Void 104 forms after baking for over 100 hrs. at 150° C.

A comparison of the voiding rates reveals that an apparent maximum in voiding rate occurs between 100° C. and 200° C. Above 200° C., the voiding rate appears to reduce sharply. Both characteristics, a peak in the voiding rate at modest bake temperature and fall off in the voiding failure rate above it are strongly indicative of stress migration. Furthermore, the population fraction of vias showing certain amounts of resistance change at a given time and temperature are widely distributed. This implies that not all vias void at the same rate, and some vias may not show evidence of voiding during the lifetime of the test.

Figure 2:
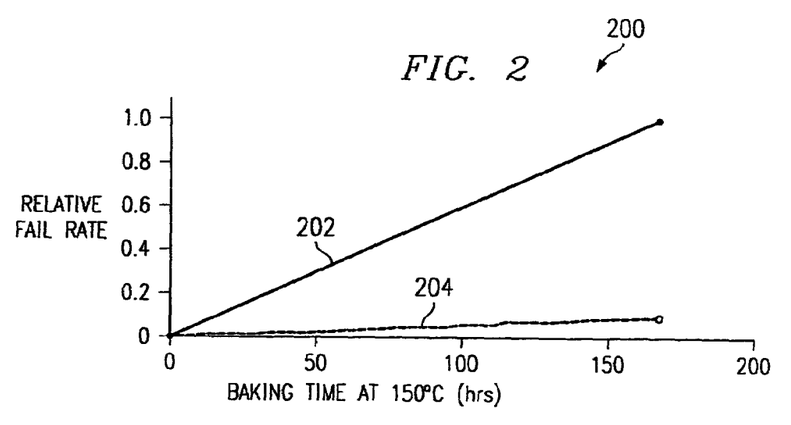
FIG. 2 depicts a chart illustrating SIV reliability effects.

FIG. 2 illustrates the effect of post-ECD annealing on via SIV reliability. Plot 200 depicts relative fail rate over a set baking time. Plot line 202 illustrates the results of Cu without post-ECD anneal, while plot line 204 illustrates the results of Cu with post-ECD anneal. Incorporation of a post-ECD anneal process after plating, but before nitride encapsulation, lowers the rate of failure by at least a factor of 10.

The observed void formation in the relatively wide metal interconnects (or leads) around a dual-damascene via appears somewhat paradoxical and raises several questions. From the viewpoint of Al-based SIV, a 3 µm wide interconnect as shown in FIG. 1 is actually quite narrow. It might be expected that interconnect hydrostatic stress will increase substantially with decreasing line width and lead to greater degrees of SIV damage in comparison to wider lines.

However, narrower, minimum-width leads around a via do not show evidence of SIV failure. This raises several questions. Why is a relatively wide lead around a via more prone to SIV damage in comparison to a narrow lead (~10×more narrow), when both possess width dimensions that might be considered suitable for SIV damage? Since Cu has a relatively high melting-point metal, such that diffusion at a similar temperature should be smaller in comparison to Al, why does SIV still poise reliability issues for Cu? Finally, why is the bottom of a via structure a region of vulnerability for SIV in dual-damascene Cu?

The void volume shown in FIG. 1 is estimated to be about 0.01 $\mu m^3$ and provides some measure of the number of coalesced vacancies. Vacancy motion leading to SIV is largely controlled by the diffusional mechanisms active within a given material. From a mass transport perspective, three major volumetric scales can be thought to define a diffusional problem. The first is interconnect volume, defined by the product of the length, height, and width of the metallic interconnect within which the damage formation is occurring. The second is diffusion volume, which is that volume available during a given bake test to supply vacancies capable of coalescing to form a void. The third is stress gradient region (or volume), which is the volume within which a significant driving force exists to compel vacancies to migrate towards a specific voiding site. The interconnect volume is simple to define. However, the diffusion volume and stress gradient region are not so simple to determine.

The diffusion volume depends on active diffusion mechanisms present (e.g., lattice structure, grain boundaries, material interfaces, material surfaces), the bake temperature, and measurement time. Diffusion mechanisms (or pathways) that help define the diffusion volume may be able to extend for long distances depending on the test temperature and time scale of the bake test. However, a diffusion pathway is of greater concern if a sufficient driving force coincides with that pathway.

The stress gradient region depends on: geometric factors that define the interconnect system; material properties of the metal, barrier, and dielectrics; and local stress levels developed at the test temperature. Stress level within the stress gradient region is also time-dependent, since the voiding process should eventually reach an equilibrium state and relax local thermal stress levels originally present at the start of the bake test.

Thus, only vacancies within some "active diffusion volume" participate in the voiding process. This "active diffusion volume" is defined by the simultaneous intersection of the interconnect volume, diffusion volume, and stress gradient region at a specific site within a device structure. Hence, "active diffusion volume" is the smallest overlapping portion of the three volumes surrounding a vulnerable SIV site.

Figure 3:
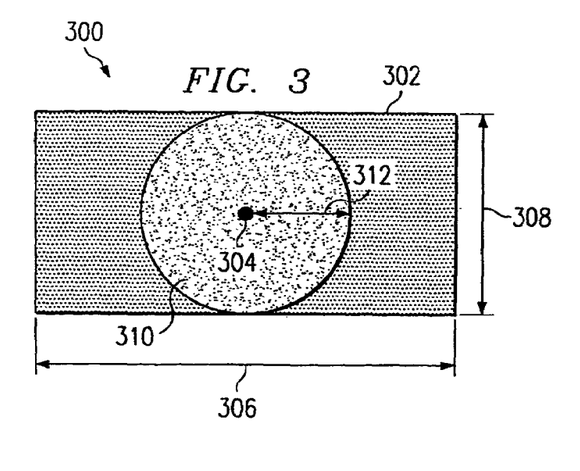
FIG. 3 illustrates a device structure.

This may be further illustrated and explained by means of an example. In this example, a sample diffusion mechanism is specified, and its consequences examined. Reference is now made to FIG. 3, which illustrates a portion 300 of a device structure. Portion 300 comprises a metal interconnect 302 in contact with a via structure 304. Interconnect 302 has length 306 and width 308. A diffusion component of a diffusion volume 310 will be able to participate in the void formation process if a stress gradient region coincides with volume 310. Assuming that is the case, volume 310 may be considered an active diffusion volume. The diffusion component has characteristic diffusion length ($X_D$) 312; where $x_D \sim \sqrt{(D^*t)}$, D is a diffusion coefficient and t is the bake time. Voiding around via 304 is the focus of concern, thus diffusion volume 310 will center on via 304 and extend radially to all diffusion components with length 312 from via 304. The length 306 of the interconnect will generally be much greater than length 312.

Assuming that grain boundary (GB) diffusion is the primary active mechanism for vacancy diffusion (with an activation energy of 1.05 eV and $D_0=0.3$ cm$^2$/sec), only vacancies located within about 2.4 µm of via 304 can contribute to voiding for a bake test at 150° C. that lasts 168 hrs. This means that an interconnect of greater width 308 will have a larger total supply of vacancies for voiding than a narrower one in a given bake time interval; assuming in both cases constant vacancy concentrations and stress gradient regions of comparable size to the diffusion volumes. Consequently, narrow interconnect lines with vias placed over them are more SIV resistant than wider interconnect lines.

In most, but not all, instances the minimum volume that defines an active diffusion volume is the stress gradient region. However, regions where stress gradients are sufficient to allow for significant mass transport places a constraint on which vacancies can have a role in SIV damage formation.

There are a number of potential stress gradients within semiconductor fabrication that would be sufficient to cause vacancy migration resulting in SIVs. Perhaps the most common is thermal stress, caused during the heating and cooling that occurs throughout semiconductor device fabrication. Most all fabrication processes utilize a number of different materials, often having very different thermo-mechanical properties. Thus, heating and cooling of multi-level interconnected structures, formed of heterogeneous materials, is non-uniform, forming a number of localized stress concentrations (e.g., warping).

Vacancies tend to migrate towards regions of lower stress. Thus, stress gradients are a primary factor in vacancy flux. Empirically, vacancy flux may be defined as:

$$J_{SIV} = N_{vac} / (A_{flux} \cdot t_F)$$

where $N_{vac}$ is the total number of vacancies having passed through to cause voiding, $A_{flux}$ is the flux area for the diffusion mechanism of interest, and $t_F$ is the failure time. $N_{vac}$ is estimated to be 0.1 µm$^3$/Ω=8.5×10$^9$ vacancies, where Ω (the Cu atomic volume)=11.8×10$^{-24}$ cm$^3$. For interface diffusion, $A_{flux} = \pi \cdot w_{via} \cdot \delta_I$, where $w_{via}$=0.18 µm is the via width and $\delta_1$ is the interface width.

The role of stress gradients in relation to vacancy migration may be illustrated in the following manner. The vacancy flux under a driving force can be expressed as:

$$J_{SIV} = C(\vec{x}, t) \cdot M \cdot F$$
$$= C(\vec{x}, t) \cdot \left( \frac{D_{0,eff} \exp(-Q_{eff}/k_B T)}{k_B T} \right) \cdot \Omega \frac{\Delta \sigma}{\Delta x}$$

where $J_{SIV}$ is the vacancy flux due to a stress gradient, C(x,t) is the local concentration, M is a diffusional mobility, F is the driving force, $D_{0,eff}$ is a effective diffusional prefactor, $Q_{eff}$ is an activation energy, $k_B$ is the Boltzmann constant, T is the absolute temperature, Ω is the local atomic volume, and Δσ/Δx is the local stress gradient. The term Δx specifies a generic linear dimension in the stress gradient and is not meant to define a specific coordinate system. Note that for simplicity, a diffusional counterflux ($\sim -D \cdot \partial C(x,t)/\partial x$) due to chemical potential differences is ignored. However, since any vacancy that is removed due to SIV should be replaced from the nearly infinite source of vacancies within the entirety of a metal interconnect outside the active diffusion volume boundary, the diffusional counterflux across this boundary should be small. This means that the vacancy concentration within the active diffusion volume should remain relatively constant throughout any finite bake test. For the sake of simplicity, if the local concentration is assumed to be a constant that is approximately equal to the inverse of the atomic volume, Ω$^{-1}$, the previous equation simplifies to:

$$J_{SIV} = \left( \frac{D_{0,eff} \exp(-Q_{eff}/k_B T)}{k_B T} \right) \cdot \frac{\Delta \sigma}{\Delta x}.$$

This may be used to estimate the level of stress gradients required to cause an SIV of the scale observed in FIG. 1. The stress gradient may be estimated utilizing an interface model with thickness $\delta_f=5\times10^{-4}$ µm. Assuming $D_{0,eff}=0.3$ cm²/sec, $Q_{eff}=0.74$ eV, T=423 K, $k_B=8.6174\times10^{-5}$ eV/K, and $t_F=168$ hrs., a stress gradient of ~6.2 MPa/µm is estimated. To see if this value is reasonable, a comparison may be made to Cu voiding under an EM driving force that is arrested by the occurrence of back stress. For an "equivalent" mass flux (current density j=5.76 MA/cm² and temperature T=350° C.) under a surface/interface mechanism, and assuming that the stress along the interconnect is about 260 MPa, and using a Blech threshold value of about 3700 A/cm in passivated Cu, a Blech threshold stress gradient in the range of 4 to 40 MPa/µm would result—depending on the value of the effective charge factor, Z*(−0.5 to −5.0). Thus, the stress gradient estimated for SIV around a via in proximity to a wide metal lead is plausible, supporting the conclusion that SIV presents serious problems in Cu metallization.

An active diffusion volume is a necessary component for vacancy transport to electrically susceptible voiding sites. Although a number of such sites may exist in various designs in various technologies, the examples thus far have focused on SIV around a via structure as previously illustrated in FIG. 1. Finite element may be utilized to estimate that, for the structure depicted in FIG. 1, somewhere on the order of 10 billion vacancies are required to completely void the via. However, the minimum number of vacancies required to cause voiding sufficient to open the via, and thus disrupt or destroy electrical conductivity, is much smaller—especially since the amount of voiding shown in FIG. 1 extends well beyond the dimensions of the via.

Since the minimum number of vacancies actually required to cause voiding is fairly small, the number of vacancies available to cause failure within the active diffusion volume is relevant. Assuming that a GB-driven diffusion length (~2.4 µm at T=150° C., $D_0=0.3$ cm²/sec, Q=1.05 eV, t=168 hrs) defines the active diffusion volume, the active volume for a 3 µm wide line that is about 0.5 µm high is 7.2 µm³. If the total number of vacancies to cause failure within the active diffusion volume is on the order of $8.5\times10^9$, the minimum total vacancy concentration is about $1.2\times10^9$ vacancies/µm³. In the same active diffusion volume, a total of 7.2 µm³/Ω=$6.1\times10^{11}$ Cu atoms exists. This means that there is at least 1 vacancy for every 500 Cu atoms.

To see what such a value means, the vacancy concentration in thermal equilibrium at 423 K with a formation enthalphy of $\Delta H_f=1.28$ eV would be ~$4.8\times10^{-5}$ vacancies/µm³. This corresponds to 1 vacancy for every $1.8\times10^{15}$ Cu atoms if thermal equilibrium was established. So, the estimated vacancy concentration is very high, definitely not in thermal equilibrium, and likely indicative of the rather defective nature of the Cu being deposited using ECD. This result may not be surprising, since ECD is a rather rapid process and is done at temperatures comparable to room temperature so that defects are effectively trapped during the deposition process. However, whatever vacancies are trapped within the Cu metal during deposition must somehow remain there without being annihilated.

Another possibility is that the vacancies are generated after ECD. The equilibrium vacancy concentration in bulk Cu at 423 K is negligible (some $10^{-13}$ times less) in comparison to the required vacancy concentration to cause the void shown in FIG. 1. Vacancies generated exclusively through thermal expansion cannot sufficiently account for the observed void size, assuming that all the extra volume from thermal expansion goes into forming excess vacancies. Thus, heat treatment in static Cu after ECD will not generate sufficient vacancies. Realistically, however, Cu that is fabricated in a manufacturing environment using a fast deposition rate ECD method is far from static. Cu is known to undergo room temperature re-crystallization after ECD, where the median grain size can change by an order of magnitude over several days. Also, Cu is known to have significant grain growth during thermal annealing even at relatively modest temperatures in comparison to its melting point. Grain growth essentially eliminates excess free space within the volume of the Cu caused by an excess density of small grains.

When the surface of a Cu film is free, the excess vacancies generated through the elimination of grain boundaries should be annihilated upon reaching the free surface. In the case of a Cu interconnect that is confined, any vacancies generated through significant amounts of grain growth will be unable to leave the Cu material. As a consequence, the remaining boundaries, interfaces, and even the bulk grains will become necessarily supersaturated with vacancies. The encapsulation process is done at temperatures in the 400° C. range, but ramp time to that temperature in modern deposition systems is very fast (on the order of tens of seconds). Thus, complete grain growth prior to full encapsulation may not be possible. So, trapped vacancies from grain growth in constrained and thermally treated Cu can form a substantial component of the vacancies present within the Cu interconnect. Subsequent via placement over the Cu interconnect would then generate a stress concentration that would tend to attract vacancies within a given active diffusion volume. An additional contributor to constrained grain growth at a lower metal level would be the additional thermal treatments that occur during processing of metal layers at higher levels.

Summarizing all of this, stress-induced voiding occurs in Cu-based, submicron, dual-damascene technologies—characterized by voids formed prominently and catastrophically in the metal level below via structures. Relatively large void sizes, and correlative calculations, indicate that metallic vacancy concentration in metallic interconnect levels in proximity to via structures is high enough to allow the vacancies to cluster at stress concentration locations prominently located around the via structures. Void causing vacancies primarily result from either: 1) vacancies trapped within an interconnect after capping and subsequent grain growth with further heat treatment; or 2) process-induced vacancies spread throughout Cu grains, grain boundaries, and interfaces, that are not eliminated during an anneal process. The SIV phenomenon is especially problematic where relatively wide metal leads are located below diffusionally isolated via structures. Referring back to FIG. 3, via 304 may be considered diffusionally isolated if there are no other via structures within volume 310 (i.e. within a diffusion length 312 away from via 304). Thus, for a given active diffusion volume, a diffusionally isolated via will have no other structures to buffer it from SIV damage. A systematic approach to minimizing diffusional SIV problems, particularly in dual-damascene structures, is required.

The present invention provides a system that substantially minimizes, and potentially eliminates, the effects of stress-induced voiding in dual-damascene structures. The present invention provides a system that addresses such effects from a structural perspective, a performance perspective, and a combined structural/performance perspective. In one embodiment of the present invention, the negative effects of SIV on device performance are mitigated through electrical buffering. In another embodiment of the present invention, the negative effects of SIV are mitigated through diffusive buffers. In yet another embodiment of the present invention, electrical buffering is employed in conjunction with diffusive buffering.

One embodiment of the present invention is now illustrated with reference to FIG. 4. A device structure 400 according to the present invention is depicted. Structure 400 comprises a lower metal interconnect 402 and an upper metal interconnect 404. Via structures 406 and 408 are sequentially disposed near an end of interconnect 404, and contact interconnect 402 to electrically couple interconnects 402 and 404. Although depicted linearly in FIG. 4, interconnect 404 and vias 406 and 408 could be configured in any desired orientation in accordance with the present invention. For example, interconnect 404 might be T-shaped, and have more than two via structures disposed thereon. Regardless of the particular configuration, electrically redundant vias 406 and 408 reduce reliability problems resulting from SIV occurring within a given active diffusion volume 410.

Utilizing multiple electrically redundant via structures to buffer each other in such a manner reduces the statistical probability that SIVs will cause reliability problems for a semiconductor device. Assuming that, for a given active diffusion volume, one via structure voids completely, the probability that a second via structure would also void completely is very small. More commonly, marginal voiding occurs to most or all of the via structures. As depicted in FIG. 4, significant, but not total, voiding is probable around via 406, and only marginal voiding is probable around via 408. Thus-the resistance through via 406 would increase significantly, but the resistance through via 408 would increase only slightly. Furthermore, electrical connectivity is not lost if one via structure voids completely. When analyzed collectively, the net resistivity increase—and hence the net increase in propagation delay—through structure 400 is minimized. In fact, depending upon the number of electrically redundant via structures employed, net resistivity increases may be eliminated altogether. Given a large enough number of via structures, not all structures will experience voiding. Generally then, a greater degree of electrical redundancy will further reduce or eliminate reliability problems associated with SIV.

There are a number of possible ways to determine how many electrically redundant via structures may be employed. Design and layout characteristics of the semiconductor process may impose a maximum limit on redundancy for a given area. Calculations of the type described above may be utilized to determine the extent of potential voiding for a given structure or design. Designers could then calculate, based on potential void volumes and vacancy characteristics, a minimum redundancy number required to ensure their required propagation delay through a structure. It should be apparent that the number of redundant via structures required varies greatly depending on the diffusion characteristics of the materials and technologies utilized. Also, placement of redundant structures relative to one another has a significant impact on the generation and profile of local stress gradients. Based upon the physical properties of the materials and technologies used, via placement geometries may also be configured to provide an optimized or desired stress gradient behavior.

Figure 4:
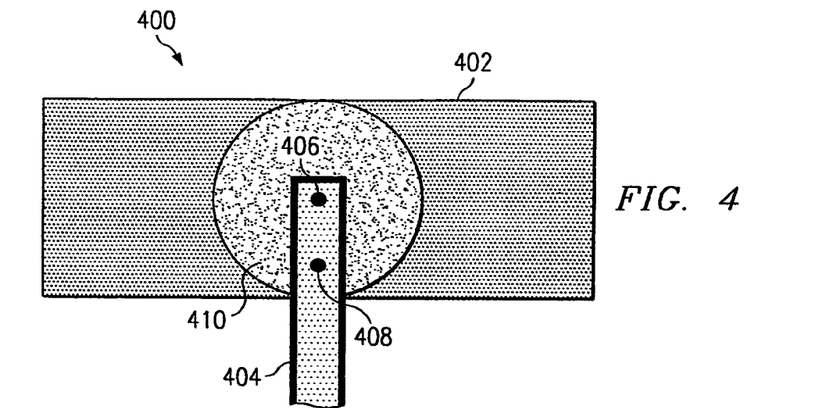
FIG. 4 illustrates a device structure according to the present invention.

For example, in structure 400 of FIG. 4, placement of via 406 at the distal end of interconnect 404 and over the center of interconnect 402 will, depending on the physical properties of the particular materials used, more than likely center a local stress gradient around via 406, rendering volume 410 an active diffusion volume. Therefore, placement of via 408 along interconnect 404 near the edge of interconnect 402 will subject via 408 to less potential SIV damage within volume 410. Via 408 may generate its own local stress gradient and corresponding active diffusion volume that could either augment or diminish volume 410. The placement of via 408 closer to the edge of interconnect 402, however, tends to reduce the available interconnect, diffusion, and stress gradient volumes, depending on the thermo-mechanical properties of adjacent materials. As a result, the statistical probability of SIV problems around via 408 may be lower than the probability of SIV problems around via 406.

Thus, while every design could potentially have different requirements, general design rules and parameters for electrical redundancy may be developed based on known material properties and the analysis disclosed herein.

The present invention also addresses the negative effects of SIV by providing diffusive buffers. In contrast to the electrically redundant embodiment described above, another embodiment of the present invention provides for diffusionally redundant via structures. These diffusionally redundant via structures, or dummy vias, are clustered in proximity to an otherwise diffusionally isolated but electrically active via structure to provide a buffer against the effects of SIV. This embodiment may be utilized when electrically redundant via structures are either not possible or not desired.

Figure 5:
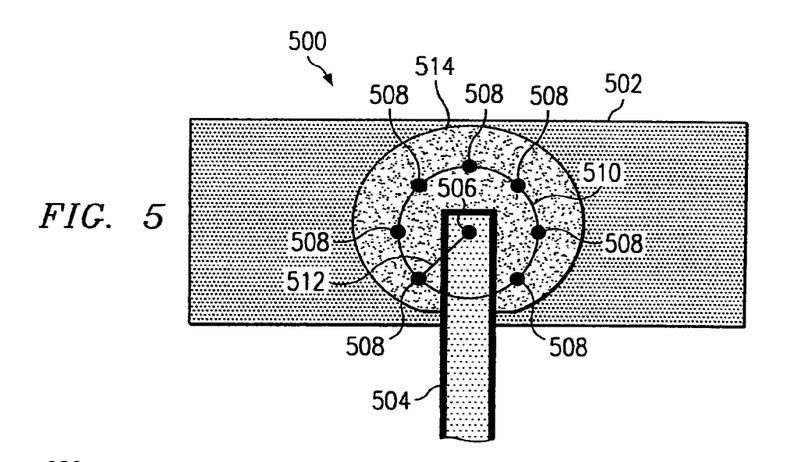
FIG. 5 illustrates a device structure according to the present invention.

Reference is now made to FIG. 5, in which a device structure 500 according to the present invention is illustrated. Structure 500 comprises a lower metal interconnect 502 and an upper metal interconnect 504. Via structure 506 is disposed near an end of interconnect 504, and contacts interconnect 502 to electrically couple interconnects 502 and 504. Via 506 may thus be considered the electrically active via (or just active via). Dummy vias 508 are disposed proximally to via 506 and, although they contact interconnect 502, they do not contact interconnect 504. Vias 508 thus provide no electrical connectivity within structure 500.

As depicted in FIG. 5., vias 508 are disposed equidistantly along a perimeter 510 that is centered on via 506 and has a radius 512 of some determinate distance. Dummy vias 508 may, alternatively, be disposed in a number of geometric patterns in relationship to via 506. Vias 508 are disposed proximal to via 506 within an active diffusion volume 514 to serve as a diffusional buffer for via 506 against SIV. Vias 508 effectively distribute and share SIV damage that occurs within volume 514, reducing or eliminating SIV damage to the active via 506. SIV is caused by the migration of vacancies within interconnect 502. From the diffusional perspective of interconnect 502, vias 508 are identical to via 506. Thus, a vacancy diffusing along a given diffusion component will migrate to the first via structure it encounters, regardless of whether that via structure is an active or dummy via.

Vacancy migration toward active via 506 cannot be eliminated completely—thus some voiding, even if marginal, is possible. However, based on the number of dummy vias selected and their orientation with respect to the active, voiding around an active via can be dramatically reduced and, effectively, eliminated. Assuming, for example, that a design completely surrounded active via 506 with a contiguous perimeter of dummy vias 508, at a minimum distance 512 from via 506, then via 506 would be subjected to vacancy migration from only a small, halo-shaped region of volume 514 immediately adjacent to via 506. The actual number of vacancies available to migrate to via 506 might thus be insufficient to cause SIV at all, or insufficient to cause SIV that results in degradation of the conductivity of via 506. Alternatively, a designer may choose to place only one dummy via in the vicinity of an active via, in order to buffer the active via from SIV just enough to prevent SIV from completely destroying the active via's conductivity.

Based upon the present invention, both extremes, and all intermediate embodiments, are possible. As with the electrically redundant vias, a greater degree of diffusional redundancy will further reduce or eliminate reliability problems associated with SIV.

There are a number of possible ways to determine how many diffusionally redundant via structures may be employed. Design and layout characteristics of the semiconductor process may impose a maximum limit on redundancy for a given area. Calculations of the type described above may be utilized to determine the extent of potential voiding for a given structure or design. Designers could then calculate, based on potential void volumes and vacancy characteristics, a minimum redundancy number required to ensure their required propagation delay through a structure. It should be apparent that the number of redundant via structures required varies greatly depending on the diffusion characteristics of the materials and technologies utilized.

As with electrically redundant vias, placement of diffusionally redundant structures relative to one another has a significant impact on the generation and profile of local stress gradients. Based upon the physical properties of the materials and technologies used, via placement geometries may also be configured to provide an optimized or desired stress gradient behavior. All such configurations are comprehended by the present invention.

Furthermore, as it should now be apparent, the diffusional and electrical redundancy embodiments may be combined to effect a number of diffusionally redundant via structures that are also electrically redundant. Based upon design requirements, and utilizing the disclosure above, designers may determine a number and orientation of electrically redundant via structures that provides diffusional buffering to one or more of those electrically redundant via structures (e.g., preferred vias).

Figure 6:
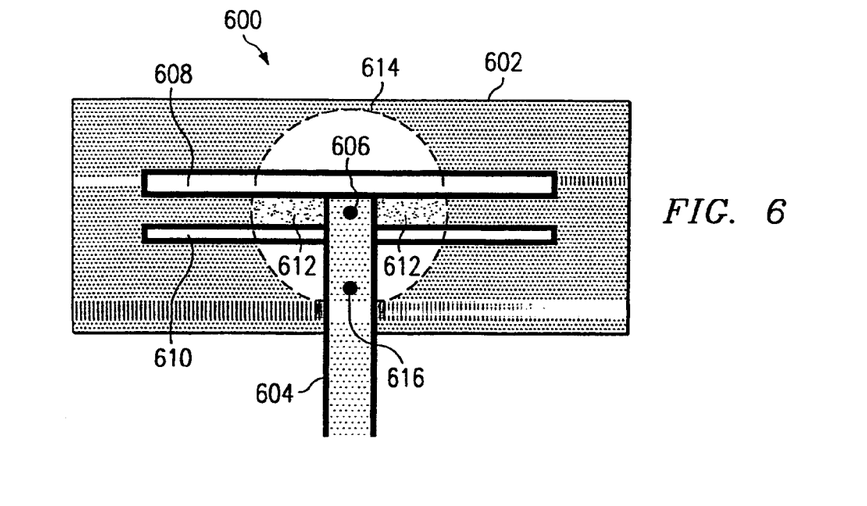
FIG. 6 illustrates a device structure according to the present invention.

Another embodiment of the present invention is now described in reference to FIG. 6. This embodiment also provides diffusive buffering—not through dummy vias, but instead through implementation of slotted structures in metal interconnects. These slotted structures are disposed to provide diffusive buffering around a particular structure (i.e., a via structure) by effectively transforming a wide interconnect into a narrow interconnect around that particular structure. The slotted structures are limited in size such that they do not alter the beneficial current carrying characteristics of a wider interconnect structure but, at the same time, render a smaller diffusion volume around a via structure. Potential stress gradients may also be substantially reduced through the support offered by slot structures, further reducing SIV damage.

FIG. 6 provides an illustration of a device structure 600 according to the present invention. Structure 600 comprises a lower metal interconnect 602 and an upper metal interconnect 604. Via structure 606 is disposed near an end of interconnect 604, and contacts interconnect 602 to electrically couple interconnects 602 and 604. Via 606 may thus be considered an electrically active via (or just active via). A first buffer slot structure 608, and a second buffer slot structure 610, are each disposed laterally along the length of interconnect 602. Slots 608 and 610 are formed by an appropriate process (e.g., deposition), of an appropriate material (e.g., dielectric), to prevent vacancy migration across their width. Slots 608 and 610 may be formed to a depth equal to that of interconnect 602, such that slots 608 and 610, for their given length, provide a complete diffusive perforation of interconnect 602. Alternatively, slots 608 and 610 may be formed to some depth less than that of interconnect 602, providing only a partial diffusive perforation of interconnect 602.

In the embodiment depicted in FIG. 6, slots 608 and 610 are formed and disposed such that via 606 contacts interconnect 602 between them. Slots 608 and 610 are generally formed and disposed so as to minimize the distance between them, allowing only enough room for the diameter of via 606. Depending upon particular process limitations or design criteria, however, this may be adjusted accordingly. Regardless of their separation distance, slots 608 and 610 should be of a sufficient length and separation distance to effectively limit the diffusive exposure of via 606 to an active diffusion volume of 612. Volume 612, because of the configuration of slots 608 and 610, is smaller than a full active diffusion volume 614—to which via 606 might otherwise be exposed in the absence of slots 608 and 610. By reducing the active diffusion volume to which via 606 is exposed, the number of vacancies and resulting likelihood of SIV damage is also reduced. Slot 608 and 610 thus buffer via 606 from sizable segments of a full active diffusion volume 614.

Depending upon particular design limitations and requirements, one or more slot structures may thus be utilized to provide diffusive buffering. As should now be apparent, this approach may also be combined with the electrical and diffusive redundancy systems described above to provide even further beneficial effects. As illustrated in FIG. 6, a second via structure 616 may be sequentially disposed along interconnect 604, such that via 616 is centered between the edge of interconnect 602 and slot 610. Via 616 may be an electrically redundant via, contacting interconnect 602 to electrically couple it to interconnect 604. As discussed in relation to FIG. 5, via 616 will also be a diffusionally redundant via. Finally, via 616 itself will only be exposed to a limited active diffusion volume between the edge of interconnect 602 and slot 610. Thus, SIV damage expected at via 616 should be minimal.

Thus, the present invention provides a safety margin to ensure reliable interconnections throughout product life, without excessively drastic change to overall interconnect layouts. The systems of the present invention are also scalable. As via structure dimensions shrink, the active diffusion volume scheme can be used to characterize and plan for the issue of stress-induced void formation prior to actual implementation of the technology. Process improvements can occur concurrently with products design utilizing with the redundancy scheme to ensure stress-induced void resistance—as long as sufficient redundancies in place are to overcome the effects of potential voiding. Tests can be run to compare whether particular diffusion mechanisms continue to present problems as via dimensions scale downwards, and thus correction for changes in diffusion mechanisms may be made.

While this invention has been described with reference to illustrative embodiments, this description is not intended to be construed in a limiting sense. Upon reference to the description, it will be apparent to persons skilled in the art that various modifications and combinations of the illustrative embodiments as well as other embodiments of the invention can be made without departing from the spirit and scope of the invention. The structures and methods of the present invention may be employed in a number of semiconductor fabrication processes. The structures and methods of the present invention may be utilized to reduce the effects of SIV damage occurring within a number of device structures and substructures.

For example, the active diffusion volume principles and analysis are applicable to other instances of via voiding, such as via voiding that occurs within a via itself (within via voiding). Voiding damage could occur in a via made through dual-damascene processes where the via and the upper metal are fabricated as one feature (i.e., no diffusion barrier separates the two, as is the case for the via structures and metal layers previously described). Voiding could arise due to vacancy diffusion from within the via, and also from vacancies that diffuse downwards into the via from a metal lead above. Such voiding might be expected to occur at the bottom of the via, but above the diffusion barrier that separates the via from a lower metal lead. Such an event would still be comprehended by the active diffusion volume analysis of the present invention. The buffering and modification schemes (electrical redundancy and diffusive redundancy) of the present invention may also be used to address such variations.

Furthermore, the present invention is applicable to constructing interconnects using a single-damascene methodology. In single-damascene methods, a via and a metal lead above are separated from each other by a diffusion barrier, because the via and the above metal trench are essentially fabricated separately. Thus, the region above the via will look like a mirror image of the region below the via. Voiding can then occur above, as well as under, the via structure. Although the nature of the gradients involved will vary slightly, due to the difference in the physical properties of the materials used to make up the over via region and the under via region, the analysis as described above will be the same. Therefore, once again, the buffering and modification schemes of the present invention are applicable.

It is therefore intended that the appended claims encompass any such modifications or embodiments.

What is claimed is:

1. A semiconductor device structure comprising:
   a first metallic interconnect;
   a second metallic interconnect having a primary via structure, said primary structure having an active diffusion volume relative to a location within the primary structure wherein voids can be located, disposed between and electrically intercoupling the first and second metallic interconnects; and
   a buffer structure disposed upon the second metallic interconnect in proximity to the primary via structure and within the diffusion volume to buffer the primary via structure from diffusive voiding occurring at a contact point between the primary via structure and the second metallic interconnect.

2. The structure of claim 1 wherein the first metallic interconnect and the primary via structure are copper-based dual damascene structures.

3. The structure of claim 1 wherein the buffer structure comprises a second via structure, disposed between sand electrically intercoupling the first and second interconnects.

4. The structure of claim 1 wherein the buffer structure comprises a second, electrically inactive, via structure, disposed upon the second metallic interconnect proximal to the primary via structure and within the active diffusion volume.

5. the structure of claim 4 wherein the buffer structure comprises an electrically inactive structure disposed upon the second metallic interconnect to immediately and completely surround the primary via structure.

6. The structure of claim 1 wherein the buffer structure comprises:
   a second via structure, disposed between and electrically intercoupling the first and second metallic interconnects; and
   a third electrically inactive, via structure, disposed upon the second metallic interconnect proximal to the primary via structure.

7. A semiconductor device for decreasing diffusive effects to a location within a primary structure, comprising:
   a primary structure having an active diffusion volume relative to a location within the primary structure where voids can be located; and
   a redundant structure within the active diffusion volume to minimize movement of voids to said location.

8. The device of claim 7 wherein the redundant structure comprises plural redundant structures.

9. The device of claim 7, wherein the redundant structure is operative relative to diffusive redundancy only.

10. The device of claim 7 wherein the redundant structure is operative relative to electrical redundancy.

11. The device of claim 7 wherein said device has a copper-based, dual-damascene structure having an active diffusion volume within the dual-damascene structure relative to a location within the dual-damascene structure to which voids can migrate.

12. The device of claim 8 wherein said device has a copper-based, dual-damascene structure having an active diffusion volume within the dual-damascene structure relative to a location within the dual-damascene structure to which voids can migrate.

13. The device of claim 9 wherein said device has a copper-based, dual-damascene structure having an active diffusion volume within the dual-damascene structure relative to a location within the dual-damascene structure to which voids can migrate.

14. The device of claim 10 wherein said device has a copper-based, dual-damascene structure having an active diffusion volume within the dual-damascene structure relative to a location within the dual-damascene structure to which voids can migrate.

15. A semiconductor device to minimize diffusive damage effects comprising:
   a first layer of interconnect material and a second layer of interconnect material partially overlapping said first layer of interconnect material and coupled to said first layer of interconnect material by a via;
   an active diffusion volume in said first layer of interconnect material within which voids can be located; and
   a structure in said first layer within said active diffusion volume to minimize migration of said voids toward said via.

16. The device of claim 15 wherein said structure is at least one via extending from said first layer and spaced from said second layer.

17. The device of claim 16 wherein said at least one via is a plurality of vias.

18. The device of claim 17 wherein said plurality of vias are equidistant from said via and spaced apart.

19. The device of claim 15 wherein said structure is at least one electrically insulating slot disposed in said first layer and within said active diffusion volume.

20. The device of claim 10 wherein said at least one slot is a plurality of spaced apart slots.

21. The device of claim 15 wherein said structure further includes at least one electrically insulating slot disposed in said first layer and within said active diffusion volume.

* * * * *